United States Patent
Ohashi et al.

(10) Patent No.: US 10,943,762 B2
(45) Date of Patent: Mar. 9, 2021

(54) INSPECTION SYSTEM, IMAGE PROCESSING DEVICE AND INSPECTION METHOD

(71) Applicant: HITACHI HIGH-TECH CORPORATION, Tokyo (JP)

(72) Inventors: Takeyoshi Ohashi, Tokyo (JP); Masami Ikota, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 158 days.

(21) Appl. No.: 16/261,784

(22) Filed: Jan. 30, 2019

(65) Prior Publication Data

US 2019/0244783 A1 Aug. 8, 2019

(30) Foreign Application Priority Data

Feb. 8, 2018 (JP) .............................. JP2018-020969

(51) Int. Cl.
| | |
|---|---|
| *H01J 37/22* | (2006.01) |
| *H01J 37/28* | (2006.01) |
| *G06T 7/00* | (2017.01) |

(52) U.S. Cl.
CPC .......... *H01J 37/222* (2013.01); *G06T 7/0004* (2013.01); *H01J 37/28* (2013.01); *G06T 2207/10061* (2013.01); *G06T 2207/30148* (2013.01); *H01J 2237/24564* (2013.01); *H01J 2237/2801* (2013.01)

(58) Field of Classification Search
CPC .. H01J 37/00; H01J 37/02; H01J 37/22; H01J 37/222; G06T 2207/10061

USPC ........................................ 250/306, 307, 311
See application file for complete search history.

(56) References Cited

U.S. PATENT DOCUMENTS

| | | | |
|---|---|---|---|
| 6,646,262 B1 | 11/2003 | Todokoro et al. | |
| 2014/0307946 A1* | 10/2014 | Nakahira | .............. G06T 7/0004 |
| | | | 382/149 |
| 2016/0148781 A1* | 5/2016 | Tsuno | ................... H01J 37/244 |
| | | | 250/307 |

FOREIGN PATENT DOCUMENTS

| | | |
|---|---|---|
| JP | 2007-123916 A | 5/2007 |
| WO | 2001-075929 A1 | 10/2001 |

\* cited by examiner

*Primary Examiner* — Jason L McCormack
(74) *Attorney, Agent, or Firm* — Miles & Stockbridge, P.C.

(57) ABSTRACT

An inspection system is provided that includes a microscope that scans a sample with a beam that is an incident electron beam, and an image processing device that controls the microscope. The image processing device performs: an acquisition process of acquiring a plurality of images relating to brightness based on an amount of a signal electron detected from the sample a result of controlling the microscope according to a s and irradiating the sample with the beam, the plurality of image acquisition condition being multiple combinations of different irradiation amounts of the beam per unit length; a first generation process of generating a plurality of actually measured profiles that show a relationship between an irradiation position of the beam in the sample and the brightness of the sample, based on the plurality of images acquired in the acquisition process; and an output process of outputting an electrical contact characteristic of the sample based on the plurality of actually measured profiles generated in the first generation process.

15 Claims, 13 Drawing Sheets

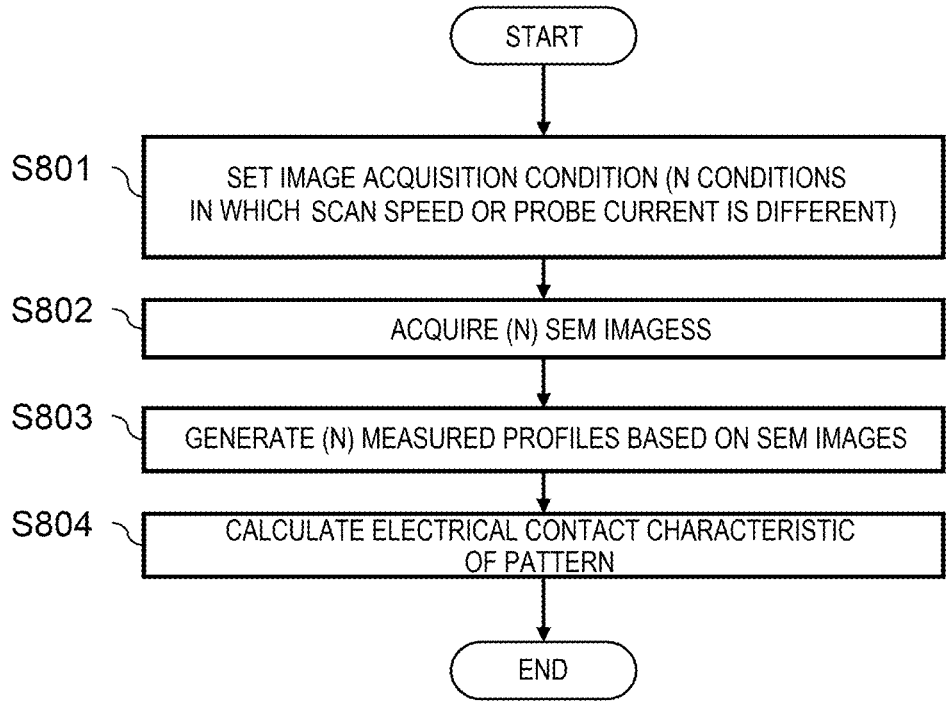
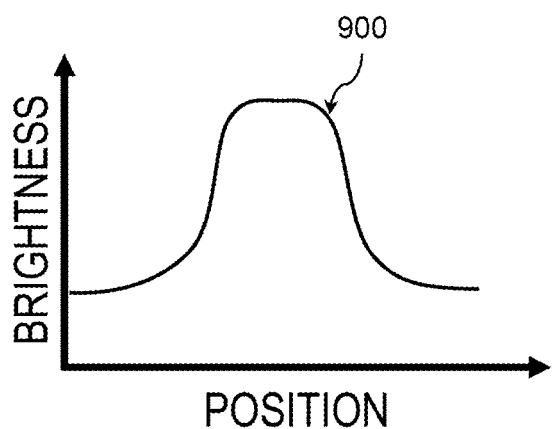

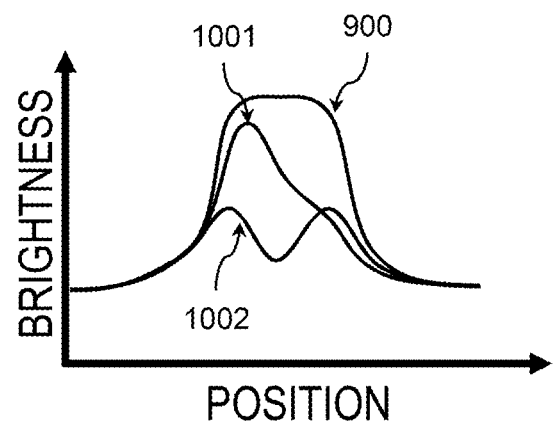
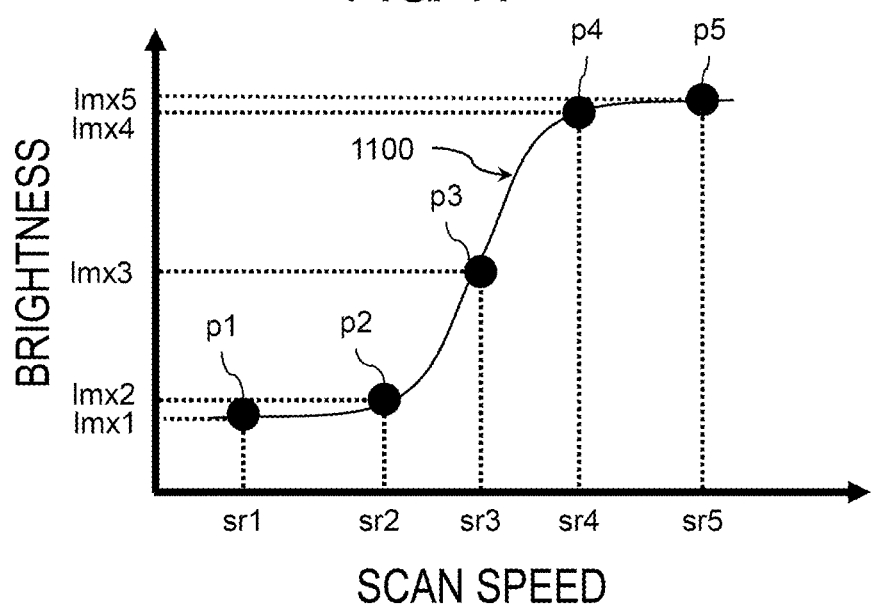

| THRESHOLD RESISTANCE | 2 | MΩ |

INSPECTION SYSTEM, IMAGE PROCESSING DEVICE AND INSPECTION METHOD

CLAIM OF PRIORITY

The present application claims priority from Japanese patent application JP 2018-020969 filed on Feb. 8, 2018, the content of which is hereby incorporated by reference into this application.

BACKGROUND OF THE INVENTION

1. Field of the Invention

The present invention relates to an inspection system that inspects a sample, an image processing device, and an inspection method.

Background Art

2. Description of the Related Art

As a method for non-destructively performing an electrical contact inspection on a semiconductor device, there is a method of performing voltage contrast observation using a scanning electron microscope (SEM). For example, SEM observation is performed under an observation condition in which positive charges are given to a surface of an insulator, and energy filtering is performed to detect secondary electrons with energy equal to or greater than a threshold energy among secondary electrons emitted from a sample due to electron beam irradiation to the sample, so that a difference in surface potential can be measured as a difference in signal amount.

The difference in signal amount is voltage contrast. When observing an electrically isolated semiconductor pattern under the above-described condition, the second electrons are decelerated because the pattern is positively charged, the proportion of the secondary electrons to be filtered by the energy filter increases, and the brightness of an SEM image decreases. An electrical contact defect can be detected by the decrease in brightness (Patent Literature 1). Further, there is a method of evaluating charge relaxation during an irradiation interval by irradiating a sample with an electron beam a plurality of times at a predetermined interval, and measuring a leakage characteristic of a semiconductor pattern, that is, a relaxation time (Patent Literature 2).
Patent Literature 1: WO01/075929
Patent Literature 2: JP-A-2007-123916

SUMMARY OF THE INVENTION

Problem to be Solved by the Invention

In an electrical contact inspection on a semiconductor device, it is desirable that a contact resistance and a parasitic capacitance can be quantitatively measured. If the contact resistance can be measured, not only determination of non-defect/defect can be achieved, but also a case where the electrical connection is made but the resistance is high can be detected, so that a high-accuracy inspection is possible. Further, if the parasitic capacitance can be measured, it can be presumed that which part of a semiconductor circuit generates a contact defect, based on the magnitude of the parasitic capacitance.

However, the electrical contact inspection using voltage contrast in the related-art can only determine the presence or absence of an electrical contact, and cannot measure the contact resistance or the parasitic capacitance. Further, along with miniaturization of the semiconductor device and changes in device structure, the parasitic capacitance decreases in case of a contact defect. Since the charge relaxation time is the product of the contact resistance and the parasitic capacitance, the relaxation time also decreases along with the miniaturization. In the related method of measuring the charge relaxation time by irradiating a sample with the electron beam a plurality of times at the predetermined interval, a relaxation time shorter than the irradiation interval cannot be evaluated. For example, in a state-of-the-art nanowire semiconductor device, the relaxation time may be on the order of nanoseconds. Meanwhile, the electron beam cannot be turned on and off at a high speed at an interval of several nanoseconds, and the relaxation time cannot be measured.

An object of the invention is to improve the accuracy of the electrical contact inspection.

Means for Solving Problem

An aspect of the invention disclosed in the present application relates to an inspection system, including a microscope that scans a sample with a beam that is an incident electron beam, and an image processing device that controls the microscope, wherein the image processing device performs: an acquisition process of acquiring a plurality of images relating to brightness based on an amount of a signal electron detected from the sample as a result of controlling the microscope according to a plurality of image acquisition conditions and irradiating the sample with the incident electron beam, the plurality of image acquisition conditions being multiple combinations of different irradiation amounts of the beam per unit length; a first generation process of generating a plurality of actually measured profiles that show a relationship between an irradiation position of the beam in the sample and the brightness of the sample, based on the plurality of images acquired in the acquisition process; and an output process of outputting an electrical contact characteristic of the sample based on the plurality of actually measured profiles generated in the first generation process.

An aspect of the invention disclosed in the present application relates to an image processing device, which is configured to control a microscope that scans a sample with a beam that is an incident electron beam, and to perform: an acquisition process of acquiring a plurality of images relating to brightness based on an amount of a signal electron detected from the sample as a result of controlling the microscope according to a plurality of image acquisition conditions and irradiating the sample with the incident electron beam, the plurality of image acquisition conditions being multiple combinations of different irradiation amounts of the beam per unit length; a first generation process of generating a plurality of actually measured profiles that show a relationship between an irradiation position of the beam in the sample and the brightness of the sample, based on the plurality of images acquired in the acquisition process; and an output process of outputting an electrical contact characteristic of the sample based on the plurality of actually measured profiles generated in the first generation process.

Effect of the Invention

According to representative embodiments of the invention, the accuracy of the electrical contact inspection can be

BRIEF DESCRIPTION OF THE DRAWINGS

FIG. 8 is a flowchart illustrating an exemplary processing procedure for calculating an electrical contact characteristic of a pattern performed by the image processing device.

FIG. 9 is a graph illustrating an actually measured profile example 1.

FIG. 10 is a graph illustrating an actually measured profile example 2.

FIG. 11 is a graph illustrating an example of scan speed dependency of brightness in the SEM image.

FIG. 24 is an explanatory diagram illustrating a display example 1 that shows distribution of measured contact resistance values on a wafer surface.

FIG. 25 is an explanatory diagram illustrating a display example 2 that shows distribution of measured contact resistance values on a wafer surface.

DESCRIPTION OF THE PREFERRED EMBODIMENTS

Embodiment 1

Exemplary Schematic Configuration of Scanning Electron Microscope (SEM)

Figure 1:
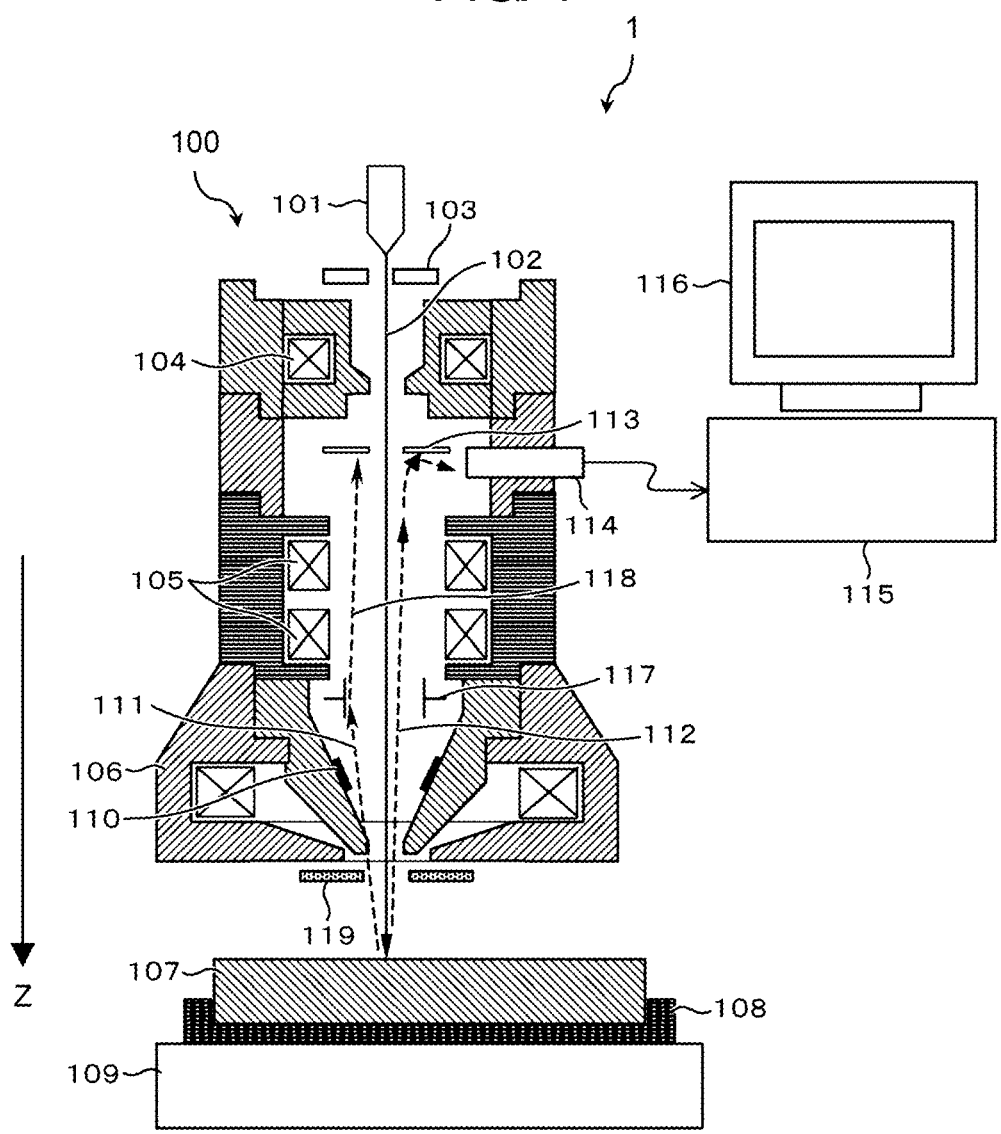
FIG. 1 is a diagram illustrating a schematic configuration of an inspection system.

FIG. 1 is a diagram illustrating a schematic configuration of an inspection system. Embodiment 1 is not limited to the SEM and can also be performed using a charged particle microscope. Here, a scanning electron microscope that irradiates while scanning an incident electron beam will be described as an example. In a case where the charged particle microscope is used, the electron may be replaced with a charged particle. The scanning electron microscope (SEM) and the charged particle microscope are collectively referred to as "microscope". The incident electron beam is a beam included in the charged particle.

An inspection system 1 includes a scanning electron microscope 100 and a control device 115 that functions as an image processing device. An electron beam 102 generated from an electron gun 101 of the scanning electron microscope 100 is accelerated by an accelerating electrode 103, converged by a condenser lens 104, deflected by a deflector 105, and then decelerated by a negative voltage (a retarding voltage) applied to a sample 107 side. Then, the electron beam 102 finally having a diameter of nm (nanometers) is converged at an objective lens 106, and is incident on a surface of a sample 107 to be observed. An irradiation direction of the electron beam 102 is set to be a Z direction that is perpendicular to a surface of a sample stage 109.

A part of a primary electron incident as the electron beam 102 becomes a reflected electron (backscattered electron) 111 after being reflected backwards, and the other part generates a secondary electron 112 while scattering inside the sample 107. Here, the retarding voltage is a negative voltage applied to the sample 107 (a sample holder 108 or the sample stage 109) side in order to converge the electron beam 102 without damaging a circuit pattern on the sample 107. The irradiation energy of the electron beam 102 is controlled by the retarding voltage.

The generated reflected electron 111 and secondary electron 112 generate a new electron after colliding with a reflection plate 113 and the new electron is detected by a detector 114. In the detector 114, a photomultiplier tube (not shown) is built and a voltage is generated corresponding to a detection amount of the new electron. The control device 115 processes the voltage and then an image display unit 116 displays an image. The control device 115 forms a profile waveform in which the vertical axis represents a signal amount and the horizontal axis represents a scan position of the electron beam, based on the secondary electron 112 emitted from the sample 107 and the like. Then, the control device 115 operates to measure a pattern dimension by obtaining a distance between peaks of the profile waveform.

Next, optical conditions under which signal detection for the secondary electron 112 and the reflected electron 111 is performed will be described. The secondary electron 112 is a signal electron with a low energy of less than about 50 [eV], and the reflected electron 111 is a signal electron with a high energy of about 50 [eV] or more. Therefore, by controlling optical parameters other than the voltage to be applied to each electrode constituting the SEM 100, it is possible to select the signal electron detection of the secondary electron 112 or the reflected electron 111 and to switch the signal electron detection therebetween. The above conditions are mainly set in (1) an electron optical system and/or (2) an electron detection system.

The reflected electron 111 and the secondary electron 112 are referred to as emitted electrons from the sample 107. Further, electrons, among the emitted electrons, detected as signals by the detector 114 are referred to as signal electrons.

In (1), for example, a negative voltage (booster voltage) greater than the voltage on the sample 107 side is applied to a facing electrode 119 or a booster electrode 110 that is disposed above the objective lens 106, so that the secondary electron 112 with a low energy can be pulled back to the sample 107 side and only the reflected electrons 111 with a high energy can be selectively detected. In this case, by applying a positive voltage to a conversion electrode 117, the reflected electron 111 moving toward an electron gun 101 side from the objective lens 106 is further pulled up and introduced to the detector 114. The electrodes to which a negative voltage is applied are not limited to the example in Embodiment 1.

In a case where the reflected electron 111 is detected as a signal electron by the above method, either a low-angle component generated at a low angle or a high-angle component generated at a high angle can be detected from the sample 107, so the total yield is high.

In (2), a method that uses an energy filter to separate the emitted electrons from the sample 107 side based on the magnitude of the energy is applied.

Figure 2:
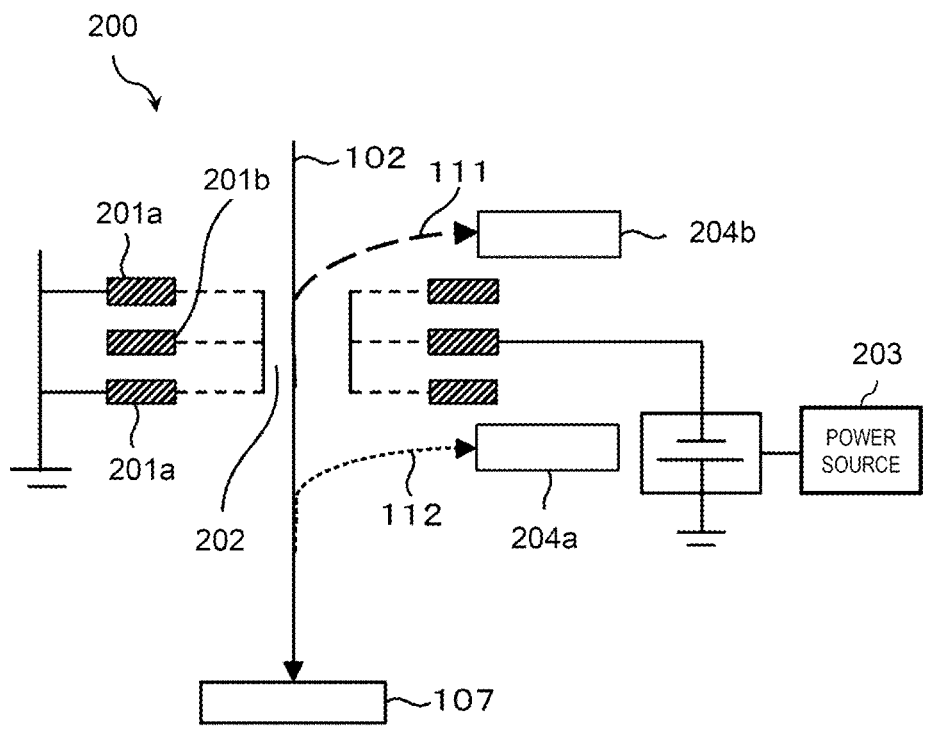
FIG. 2 is an explanatory diagram illustrating an exemplary basic structure of an energy filter.

FIG. 2 is an explanatory diagram illustrating an exemplary basic structure of an energy filter. An energy filter 200 includes two shield meshes 201a and a filter mesh 201b. Further, an opening 202 for passing the electron beam 102 is provided in the meshes. The filter mesh 201b may be single or plural, and is connected to a power source 203 for applying a filter voltage. The reflected electron 111 and the secondary electron 112 separated based on the magnitude of the energy are detected by a reflected electron detector 204a and a secondary electron detector 204b, respectively.

In the above method, only the reflected electron 111 of the high-angle component reflected at a high angle from the sample 107 substantially in the direction of an optical axis can be detected with high accuracy. The above methods of (1) and (2) can also be combined as appropriate depending on the purpose and application.

Further, Embodiment 1 is not limited to the above (1) and (2), and in addition to this, optical parameters such as a current and voltage applied or supplied to other electrodes and coils constituting the SEM can be controlled to set optical conditions of signal detection for the reflected electron 111 and the secondary electron 112. The voltage or current is applied or supplied to each electrode and coil constituting the SEM 100 by the control device 115.

Exemplary Hardware Configuration of Control Device 115

Figure 3:
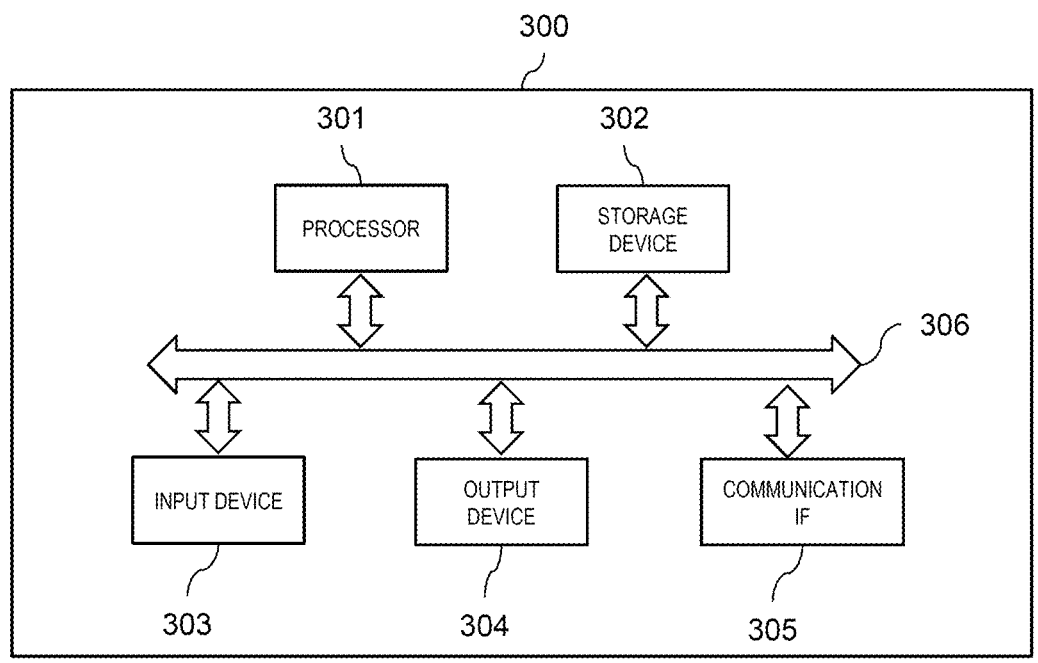
FIG. 3 is a block diagram illustrating an exemplary hardware configuration of an image processing device.

FIG. 3 is a block diagram illustrating an exemplary hardware configuration of the control device 115. The control device 115 includes a processor 301, a storage device 302, an input device 303, an output device 304 and a communication interface (IF) 305. The processor 301, the storage device 302, the input device 303, the output device 304 and the communication IF 305 are connected via a bus 306. The processor 301 controls the control device 115. The storage device 302 is a work area of the processor 301. Further, the storage device 302 is a non-temporary or temporary recording medium that stores various programs and data. The storage device 302 can be, for example, a ROM (Read Only Memory), a RAM (Random Access Memory), an HDD (Hard Disk Drive) or a flash memory. The input device 303 inputs data. The input device 303 can be, for example, a keyboard, a mouse, a touch panel, a ten key or a scanner. The output device 304 outputs data. The output device 304 can be, for example, a display or a printer. The communication IF 305 is connected to the scanning electron microscope 100, and send/receive data.

Example of Electron Beam and Sample During SEM Observation

Figure 4:
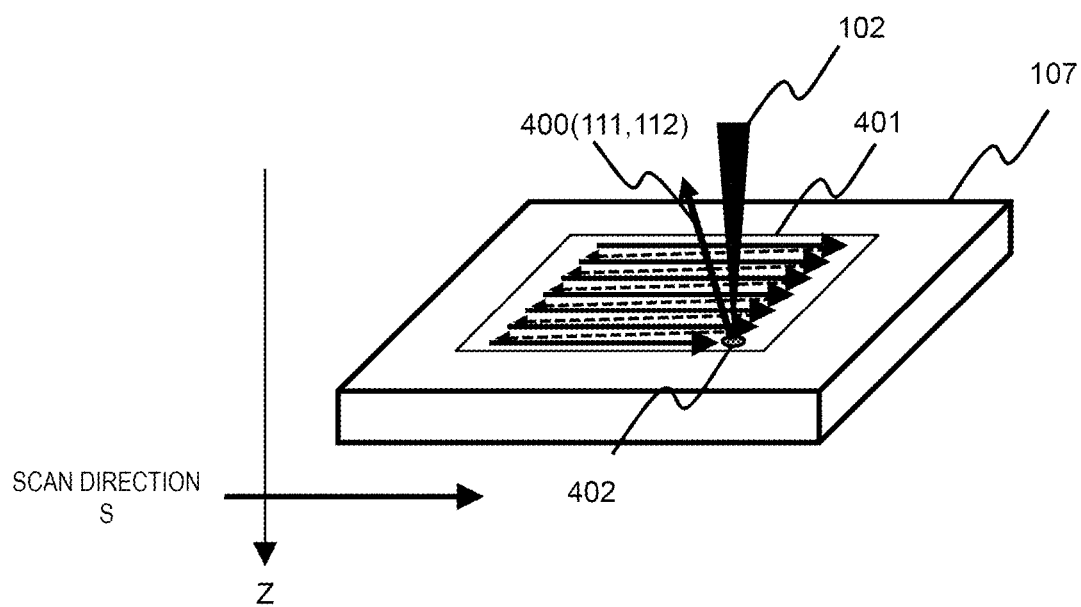
FIG. 4 is an explanatory diagram illustrating an example of an electron beam and a sample during SEM observation.

FIG. 4 is an explanatory diagram illustrating an example of the electron beam and the sample during SEM observation. The scanning electron microscope 100 irradiates the sample 107 with the incident electron beam 102 so as to detect the emitted electron from the sample 107 (the reflected electron 111 or the secondary electron 112). The amount of signal electrons 400 depends on a surface shape of the sample 107.

Therefore, the scanning electron microscope 100 scans irradiation positions 402 with the incident electron beam 102 within a field of view 401 and displays the amount of the signal electron as brightness for each of the irradiation positions 402 on the image display unit 116. Accordingly, an image 600 (see FIG. 6) that reflects the shape of the sample 107 within the field of view 401 is obtained.

FIG. 4 illustrates an example in which the incident electron beam 102 sweeps continuously from a left end of the field of view 401 in one direction (the arrow pointing to the right in FIG. 4) of a scan direction S. The scan direction S may be changed during the scanning and the field of view 401 may be scanned discontinuously as long as the scan method allows the electron beam 102 to pass through the field of view 401.

Figure 5:
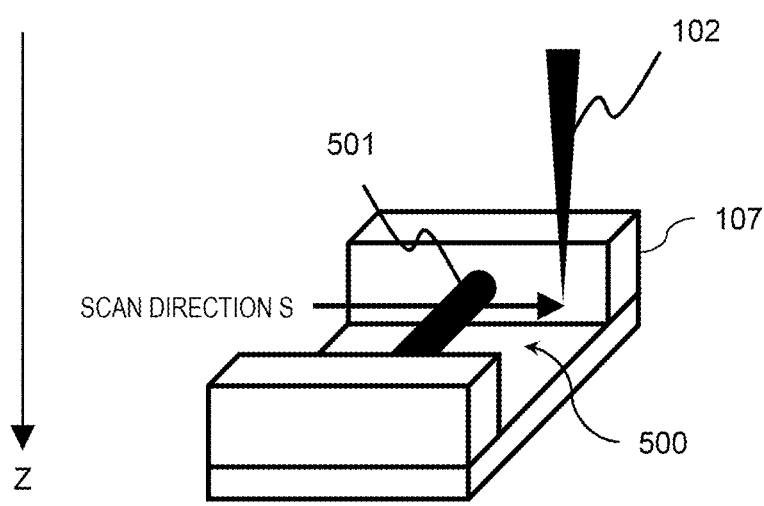
FIG. 5 is a partially enlarged diagram of an SEM observation example of a nanowire pattern illustrated in FIG. 4.

FIG. 5 is a partially enlarged diagram of an SEM observation example of a nanowire pattern illustrated in FIG. 4. A recessed portion 500 is formed in the sample 107, and a nanowire-shaped fine pattern (sometimes simply referred to as "pattern") 501 passes over two opposing side surfaces of the recessed portion 500. The scanning electron microscope 100 causes the electron beam 102 to scan in a manner of traversing the fine pattern 501. The invention is not limited to the nanowire-shaped fine pattern 501 and a fine pattern 501 in any shape may be used.

Figure 6:
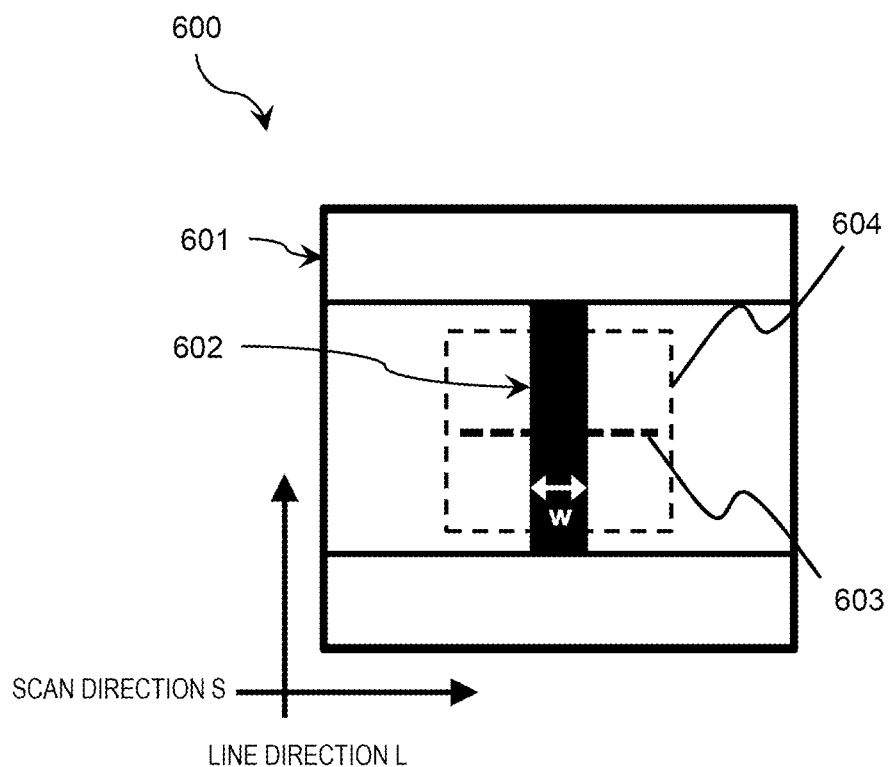
FIG. 6 is an explanatory diagram illustrating an example of an SEM image.

FIG. 6 is an explanatory diagram illustrating an example of an SEM image. An SEM image 600 illustrated in FIG. 6 is an image viewed from the irradiation direction of the electron beam 102. The SEM image 600 is an image obtained by scanning and irradiating the nanowire-shaped fine pattern 501 of the sample 107 illustrated in FIG. 5 with the incident electron beam 102. The SEM image 600 includes an image 601 of the sample 107 and an image 602 of the fine pattern 501. w is a width (pattern width) of the image 602 of the fine pattern 501 in the scan direction S.

Figure 7:
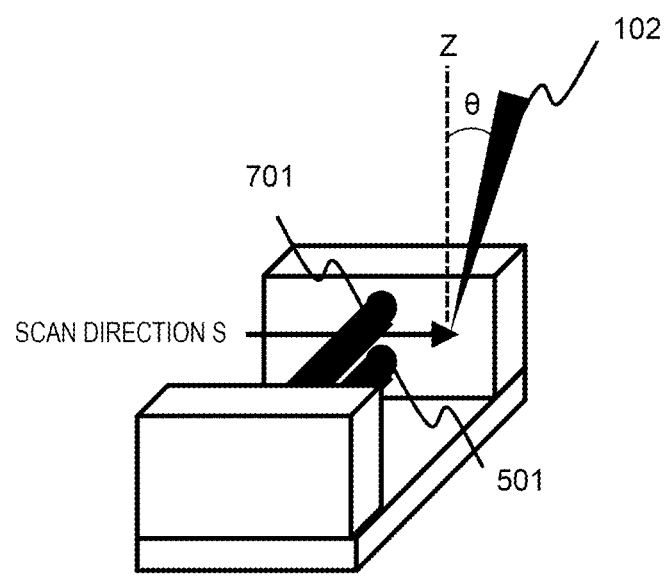
FIG. 7 is a partially enlarged diagram of another SEM observation example of a fine pattern.

FIG. 7 is a partially enlarged diagram of another SEM observation example of the fine pattern 501. FIG. 7 is an example in which the incident electron beam 102 is emitted obliquely from an upper side. The sample 107 illustrated in FIG. 7 includes two or more (two in FIG. 7) fine patterns 702 and 501 arranged in a vertical direction Z. In a case where the incident electron beam 102 is incident in the vertical direction Z, only the pattern 701 at a top stage can be observed. When the incident electron beam 102 is incident on the sample 107 at an incident angle θ with respect to the vertical direction Z, the pattern 501 at a lower stage can be irradiated and can be observed.

Exemplary Processing Procedure for Calculating Electrical Contact Characteristic of Pattern FIG. 8 is a flowchart illustrating an exemplary processing procedure for calculating an electrical contact characteristic of the pattern performed by the control device 115. Specifically, for example, the processing illustrated in the flowchart of FIG. 8 is implemented by causing the processor 301 to perform a program stored in the storage device 302 illustrated in FIG. 3.

The control device 115 sets, for example, N (N is an integer of 2 or more) different image acquisition conditions by the operation of an operator (step S801). The image acquisition conditions are combinations of a scan speed and a probe current of the electron beam 102. The scan speed is the speed of moving the electron beam 102 at the irradiation positions 402. The probe current is the current of the incident electron beam 102.

Here, the N image acquisition conditions may be combinations of conditions in which at least one of the scan speed and the probe current is different. Specifically, for example, in the N image acquisition conditions the scan speed in any image acquisition condition may be set to be the same while the probe current in any image acquisition condition may be set to be different.

Further, in the N image acquisition conditions, the probe current in any image acquisition condition may be set to be the same while the scan speed in any image acquisition condition may be set to be different. Furthermore, the scan speed and the probe current in any of the N image acquisition conditions may be set to be different. That is, at least one of the scan speed and the probe current may be set to be different among the N image acquisition conditions.

To change the scan speed or the probe current is to change a charge irradiation density per unit length. If the magnitude (magnification) of the field of view 401 is changed, the scan speed will also be changed. For example, if the field of view 401 is enlarged, the magnification decreases, and if a scan time of the incident electron beam 102 is constant, the scan speed increases. Meanwhile, if the field of view 401 is reduced, the magnification increases, and if the scan time of the incident electron beam 102 is constant, the scan speed decreases. Therefore, the image acquisition conditions can be specified in the form of the charge irradiation density per unit length or magnification.

With respect to the image acquisition conditions to be set, standard image acquisition conditions set in advance may be used, and the image acquisition conditions may be set by inputting or selecting by an operator of the SEM 100. It is desirable that the image acquisition conditions to be set are selected so as to change the charge irradiation density per unit length over a wide range.

The control device 115 acquires N SEM images 600 by irradiating the sample 107 with the electron beam 102 from the scanning electron microscope 100 under the N image acquisition conditions set in step S801 (step S802). Although the image acquisition condition other than those specified at step S801 when acquiring an SEM image is arbitrary, it is desirable that the image acquisition condition allows the image brightness to respond sensitively to the surface charge of the sample 107. For example, there is a method of emphasizing a contrast corresponding to the surface charge of the sample 107 (so-called voltage contrast) by removing electrons with an accelerating voltage lower than a threshold voltage from the signal electrons 400, using the energy filter 200 illustrated in FIG. 2.

The control device 115 generates N actually measured profiles based on the N SEM images 600 acquired in step S802 (step S803). The actually measured profile is a brightness profile acquired from an SEM image 600. Specifically, for example, in the SEM image 600 of FIG. 6, a brightness data vector on a profile extraction line 603 traversing the image 602 of the pattern to be irradiated by the incident electron beam 102 is a brightness profile. The profile extraction line 603 corresponds to the scan direction S. The brightness data vector is a data vector that shows the brightness corresponding to a detection amount of the signal electrons 400 when the incident electron beam 102 scans in the scan direction S. Further, the brightness profile acquired from the SEM image 600 is an actually measured profile. Here, specific examples of the actually measured profile will be described.

FIG. 9 is a graph illustrating an actually measured profile example 1 and FIG. 10 is a graph illustrating an actually measured profile example 2. FIG. 9 illustrates an example of one actually measured profile 900 acquired from one SEM image 600, and FIG. 10 illustrates an example of N actually measured profiles (900, 1001, 1002) acquired from N SEM images 600 (for example, N=3 in FIG. 10). In FIG. 9 and FIG. 10, the horizontal axis represents an irradiation position 402 of the incident electron beam 102 on the profile extraction line 603, and the vertical axis represents the brightness of the pattern to be irradiated at the irradiation position 402.

FIG. 9 illustrates the actually measured profile 900 in a case where the pattern to be irradiated is in a one-dimensional shape as the pattern 501 in FIG. 5. In the actually measured profile 900, the brightness increases in positions where the pattern to be irradiated exists. In this case, the pattern to be irradiated is observed as a line shape as the SEM image 600 in FIG. 6.

The control device 115 can enlarge and set a profile extraction area 604, which is an extraction range of the profile extraction line 603, in a line direction L by the operation of an operator. When the profile extraction area 604 is enlarged, more profile extraction lines 603 can be set and an average brightness profile is obtained. Therefore, an S/N ratio of the actually measured profile 900 can be improved.

Further, in a case where the pattern to be irradiated is in a two-dimensional shape as a hole pattern that is a hole, it is desirable that the magnitude of the profile extraction area 604 is set to the extent that a width of the hole pattern does not change greatly within the profile extraction area 604.

Further, it is desirable that the profile extraction area 604 is set such that a positional relationship between the profile extraction area 604 and the pattern to be irradiated does not vary from measurement to measurement. For example, a method is desirable in which the magnitude of the profile extraction area 604 is set in advance, image recognition is performed at a pattern position within the field of view 401 and the profile extraction area 604 is disposed according to an image recognition result.

Further, in order to improve the S/N ratio, the control device 115 may enlarge the profile extraction area 604 automatically or the operator of the SEM 100 may enlarge the profile extraction area 604 manually, within a range where the extraction position of the brightness profile does not change greatly. Furthermore, when the operator or evaluator determines that the S/N ratio of the obtained actually measured profile is not sufficient, the control device 115 may smooth the actually measured profile 900 by any smoothing method.

Further, since N SEM images 600 are acquired in step S802, N actually measured profiles (9000, 1001, and 1002) are obtained in step S803, as illustrated in FIG. 10. When image brightness adjustment or the like is applied to each SEM image 600, the relative comparison between the N actually measured profiles is difficult. Therefore, it is desirable that the control device 115 sets brightness adjustment conditions to be the same when acquiring the SEM images 600, or that the control device 115 corrects the obtained actually measured profile to compensate the brightness adjustment.

Returning to FIG. 8, the control device 115 calculates the electrical contact characteristic of the pattern based on the N actually measured profiles obtained in step S803 and ends a series of processes (step S804). The electrical contact characteristic includes at least one of a contact resistance R of the sample 107, a parasitic capacitance C and a parameter relevant to at least one of the contact resistance R and the parasitic capacitance C. The parameter relevant to at least one of the contact resistance R and the parasitic capacitance C includes a parameter serving as a calculation source of at least one of the contact resistance R and the parasitic capacitance C, or a parameter containing at least one of the contact resistance R and the parasitic capacitance C which are inherent.

Specifically, for example, the above parameter includes a relaxation time T of charge leakage from the pattern 501. Since the relaxation time T refers to a time until a steady state is reached, that is, a time constant RC, the contact resistance R and the parasitic capacitance C are inherent. For example, when the contact resistance R and the relaxation time T are calculated in step S804, the capacitance C is obtained using C=T/R. Further, the parameter relevant to at least one of R and C includes a voltage value or a current value that is a calculation source of the contact resistance R or the parasitic capacitance C.

The calculation of the electrical contact characteristic will be described in detail. For example, in a case where 5 image acquisition conditions (N=5) are set to have different scan speeds in step S801, the control device 115 extracts a maximum brightness value for each actually measured profile and plots the maximum brightness values so as to generate scan speed dependency. FIG. 11 illustrates a graph in which the maximum brightness values are plotted.

FIG. 11 is a graph illustrating an example of scan speed dependency of brightness in the SEM image 600. In FIG. 11, the horizontal axis represents the scan speed and the vertical axis represents the brightness of the pattern to be irradiated corresponding to the scan speed. 5 plotted points p1 to p5 indicate maximum brightness values lmx1 to lmx5 extracted from actually measured profiles under image acquisition conditions (probe currents are the same) of 5 different scan speeds sr1 to sr5. The scan speed dependency of brightness 1100 is a curve passing through the points p1 to p5, and is a monotonically increasing function as illustrated in FIG. 11 or a monotonically decreasing function (not shown).

In the scan speed dependency 1100 of brightness, the point p3 is a change point. The change point is, for example, a point at which the inclination of the scan speed dependency 1100 of brightness is maximum. The scan speed at this change point is called "a specified scan speed". In the example of FIG. 11, the scan speed sr3 of the point p3 is the specified scan speed. The scan speed dependency 1100 of brightness and the specified scan speed belong to the electrical contact characteristic because the scan speed dependency 1100 of brightness and the specified scan speed also belong to the parameter relevant to at least one of the contact resistance R and the parasitic capacitance C.

Therefore, when the above relaxation time T is defined using the specified scan speed, the relaxation time T of charge leakage from the pattern 501 is a time necessary for the incident electron beam 102 to pass through the pattern 501 at the specified scan speed, that is, a time obtained by dividing the pattern width w (the distance that the incident electron beam 102 passes through the pattern 501 in the scan direction S) by the specified scan speed.

Although the maximum brightness values on the vertical axis in FIG. 11 are used, an average brightness value of the pattern to be irradiated or brightness at a center of the pattern to be irradiated may be used instead. The control device 115 may obtain other values that are brightness indicators of the pattern to be irradiated through statistical processing of the actually measured profiles and use the same.

As a method of obtaining a specified scan speed from a plot, a method that uses fittings such as a step function and an error function is effective, and any method that determines a change point at which the scan speed transfers from a lower value to a higher value may also be used. On this occasion, since the larger the number N of the image acquisition conditions is, the more accurate the determination of the change point is, it is desirable that N is increased as long as the measurement time allows.

Meanwhile, in a case where the change point illustrated in FIG. 11 is not observed, the relaxation time T of charge leakage is either extremely long or extremely short and it can be found that there is no relaxation time T in at least a measurable range.

The pattern width w used for calculating the relaxation time T of charge leakage based on the specified scan speed may be measured based on an SEM image 600 that has the highest brightness among the N SEM images 600 obtained in step S802. Further, an average measurement value obtained based on all N SEM images 600 may also be used. Furthermore, the pattern width w may also be measured based on an SEM image obtained under an image acquisition condition that is suitable for another dimension measurement in step S802. Any existing method may be used to measure the dimension based on the SEM images 600. Further, instead of measuring based on the SEM images 600, a constant value such as a designed value may be input in advance and be used.

Further, although the scan speed is used on the horizontal axis in FIG. 11, the time necessary for the incident electron beam 102 to pass through the pattern 501 may also be used. Accordingly, since the maximum brightness value at the change point corresponds to the specified scan speed, the time at the change point is the relaxation time T of charge leakage.

The relaxation time T of charge leakage at a semiconductor circuit that is the sample 107 is generally the product of the contact resistance R and the parasitic capacitance C. Therefore, the control device 115 can calculate either one of the contact resistance R and the parasitic capacitance C by assuming the other one or by measuring or estimating using other methods.

Figure 12:
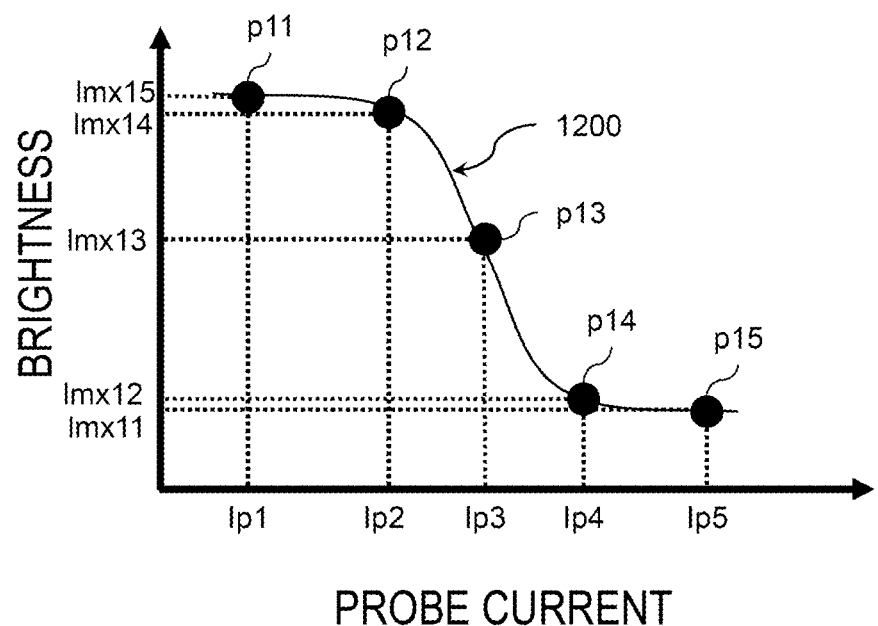
FIG. 12 is a graph illustrating an example of probe current dependency of brightness in the SEM image.

FIG. 12 is a graph illustrating an example of probe current dependency of brightness in the SEM image 600. FIG. 12 is an example in which the horizontal axis is changed from the scan speed in FIG. 11 to the probe current. The probe current is a current amount of the incident electron beam 102. 5 plotted points p11 to p15 indicate maximum brightness values lmx11 to lmx15 extracted from 5 actually measured profiles under image acquisition conditions (scan speeds are the same) of 5 different probe currents $I_p1$ to $I_p5$.

The control device 115 extracts a maximum brightness value for each actually measured profile and plots the points p11 to p15 so as to generate probe current dependency 1200. The probe current dependency 1200 also belongs to the electrical contact characteristic. Accordingly, as in FIG. 11, the point p13 is taken as the change point, the probe current $I_p3$ is specified as a specified probe current as the specified scan speed is specified. The probe current dependency 1200 of brightness is a curve passing through the points p11 to p15, and is a monotonically decreasing function as illustrated in FIG. 12 or a monotonically increasing function (not shown).

Here, the spectrum of the signal electrons 400 will be described before describing the method of calculating the electrical contact characteristic of the pattern 501 based on the specified probe current.

Figure 13:
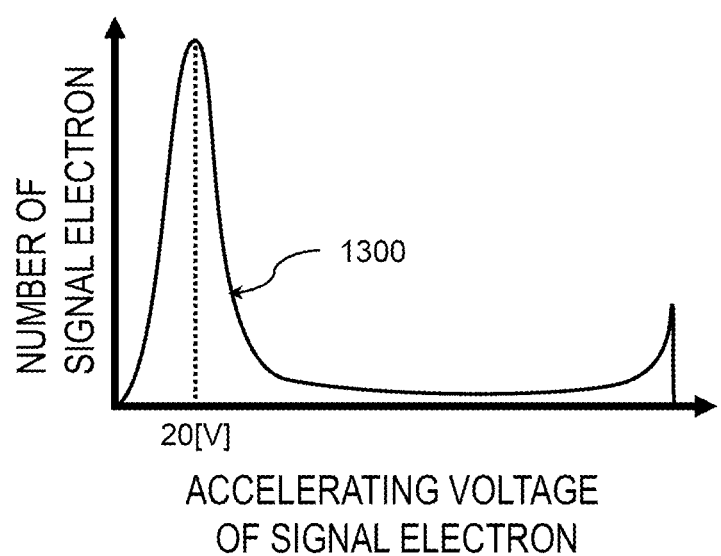
FIG. 13 is a graph illustrating an example of a spectrum characteristic of signal electrons.

FIG. 13 is a graph illustrating an example of a spectrum characteristic of the signal electrons 400. The horizontal axis of FIG. 13 represents an accelerating voltage of the signal electrons 400, that is, a voltage of the emitted electrons from the sample 107 when the sample 107 is irradiated with the incident electron beam 102. The vertical axis represents the number of signal electrons that are detected by the detector 114. Spectrum characteristic 1300 in FIG. 13 is a histogram of the number of the signal electrons. The signal electrons 400 generally have a spectrum characteristic 1300 illustrated in FIG. 13, and include many low-accelerated electrons with an accelerating voltage of 50 [V] or lower. When the surface of the sample 107 is positively charged, electrons with an accelerating voltage lower than the potential of the sample 107 cannot escape from the sample 107 and thus cannot be detected by the detector 114 as signal electrons 400.

Figure 14:
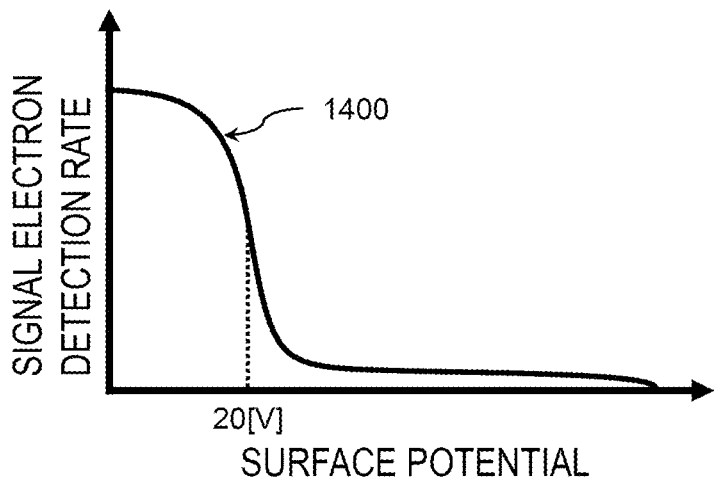
FIG. 14 is a graph illustrating an example of surface potential dependency of a signal electron detection rate.

FIG. 14 is a graph illustrating an example of surface potential dependency of a signal electron detection rate. The horizontal axis in FIG. 14 represents the surface potential of the sample 107, which is the product of the contact resistance R and the probe current $I_p$ of the sample 107. The vertical axis represents the signal electron detection rate. The signal electron detection rate is a proportion of the number of signal electrons 400 detected by the detector 114, with respect to the emitted electrons (the reflected electron 111 (backscattered electron) and the secondary electron 112) from the sample 107 in an ideal state (a state where the sample 107 is not charged).

Signal Electron Detection Rate=Number of Detected Signal Electrons/Emitted Electrons from Sample 107 in Ideal State As a result, the signal electron detection rate decreases as the surface potential of the sample 107 increases, as illustrated by the surface potential dependency 1400 in FIG. 14. Since a peak voltage at a low accelerating voltage side of the spectrum characteristic 1300 in FIG. 13 is about 20 [V], the signal electron detection rate decreases sharply at about 20 [V] in FIG. 14. The surface potential dependency 1400 also belongs to the electrical contact characteristic.

Further, in a case where the energy filter 200 is used to remove electrons with an accelerating voltage lower than the threshold voltage from the emitted electrons, it is necessary that the signal electrons 400 have an accelerating voltage higher than the threshold voltage, in order to be detected even after being decelerated by charging. Therefore, in this case, the horizontal axis in FIG. 14 is changed from the surface potential into the sum of the surface potential and the threshold voltage. That is, the sharp decrease of the signal electron detection rate occurs near a voltage obtained by subtracting the threshold voltage of the energy filter 200 from 20 [V].

Meanwhile, in a case where the scan speed is extremely slow, the surface potential of the sample 107 is approximately the product of the contact resistance R and a current amount $I_0$ effectively flowing into the sample 107. The current amount $I_0$ effectively flowing into the sample 107 is a difference between a current amount $I_e$ of the emitted electrons from the sample 107 and a current amount of the incident electron, that is, a probe current $I_p$. The current amount $I_e$ of the emitted electrons depends on the shape of the sample 107 and the accelerating voltage of the incident electron beam 102, and is about twice the probe current $I_p$ if the accelerating voltage is about 1 [kV]. That is, the current amount $I_0$ effectively flowing into the sample 107 is approximately the same as the probe current $I_p$. Therefore, the surface potential is approximately the product of the contact resistance R and the probe current $I_p$.

The specified probe current $I_p$ (the probe current $I_p$3 in FIG. 12) obtained from FIG. 12 corresponds to a voltage at which the signal electron detection rate decreases sharply. Therefore, in a case where the energy filter 200 is not used, a value obtained by dividing a voltage of 20 [V] by the specified probe current $I_p$ is approximately the contact resistance R. In a case where the energy filter 200 is used, instead of the voltage of 20 [V], a voltage obtained by subtracting the threshold voltage from 20 [V] may be used to be divided by the specified probe current $I_p$. That is, the control device 115 can calculate the specified probe current $I_p$ or the contact resistance R as an electrical contact characteristic of the pattern.

Although the voltage at which the signal electron detection rate decreases is approximately 20 [V], the control device 115 may acquire the spectrum characteristic 1300 in FIG. 13 more accurately using experiments or simulations and accordingly determine the voltage at which the signal electron detection rate decreases. Further, although the current amount $I_e$ effectively emitted from the sample 107 is approximately the same as the probe current $I_p$ in the above method, the current amount $I_e$ may be determined more accurately using experiments or simulations.

Further, the control device 115 sets the N image acquisition conditions so as to change both the scan speed and the probe current in step S801, obtains the relaxation time T of charge leakage, that is, the product RC of the contact resistance R and the parasitic capacitance C based on the scan speed dependency 1100 of brightness in step S804, and obtains the contact resistance R based on the probe current dependency 1200 of brightness, so that both the contact resistance R and the parasitic capacitance C can be obtained.

Although a method of pre-determining N image acquisition conditions has been described in Embodiment 1, the implementation method is not limited to the method described above. For example, the control device 115 repeats steps S802 to S804 for each image acquisition condition so as to add data (scan speed and probe current) to FIG. 11 or FIG. 12. Thereafter, the control device 115 terminates repetition of steps S802 to S804 when sufficient data for electrical contact characteristic evaluation is obtained in step S804, that is, when the specified scan speed and the specified probe current can be confirmed with the plots in FIG. 11 and FIG. 12. Accordingly, an effective inspection can be performed.

Further, in a case where the electrical contact characteristic evaluation in step S804 cannot be achieved sufficiently with the data obtained under the N image acquisition conditions, the control device 115 may repeat step S802 and step S803 again after other image acquisition conditions are further added. Further, as another method, it is also effective that the control device 115 roughly changes the image acquisition conditions, roughly estimates the specified scan speed and the specified probe current in step S804, finely changes the image acquisition conditions in a range close to the above image acquisition conditions, repeats Embodiment 1, and accurately determines the specified scan speed and the specified probe current.

In a case where a sample 107 to be inspected is the sample 107 illustrated in FIG. 7, the control device 115 may extract actually measured profiles only in an area corresponding to the pattern 501 at the lower stage in step S803 of FIG. 8. Accordingly, similar to the sample 107 illustrated in FIG. 5, the electrical contact characteristic can be calculated.

Accordingly, the relaxation time T can be calculated as the electrical contact characteristic of the pattern 501 according to Embodiment 1. Therefore, either one of the contact resistance R and the parasitic capacitance C can be obtained by assuming the other one or by measuring or estimating using other methods. Accordingly, for example, in an electrical contact inspection of a semiconductor device, not only determination of non-defect/defect can be achieved, but also a case where the electrical connection is made but the contact resistance R is high can be detected, so that a high-accuracy inspection is possible. Further, based on the magnitude of the parasitic capacitance C, it can be estimated which part of the semiconductor circuit generates an electrical contact defect.

Embodiment 2

Embodiment 2 will be described. In Embodiment 1, an example has been described in which the control device 115 obtains the relaxation time T as the electrical contact characteristic of the pattern 501, so as to obtain either one of the contact resistance R and the parasitic capacitance C by assuming the other one or by measuring or estimating using other methods. In contrast with this, the control device 115 in Embodiment 2 calculates the contact resistance R and the parasitic capacitance C by applying simulations. The description will be given in detail below. Here, in order to focus the description on the contents of Embodiment 2, the same reference numerals and the same step numbers are attached to the same contents as those in Embodiment 1, and the description thereof will be omitted.

Exemplary Processing Procedure for Calculating Electrical Contact Characteristic of Pattern 501

Figure 15:
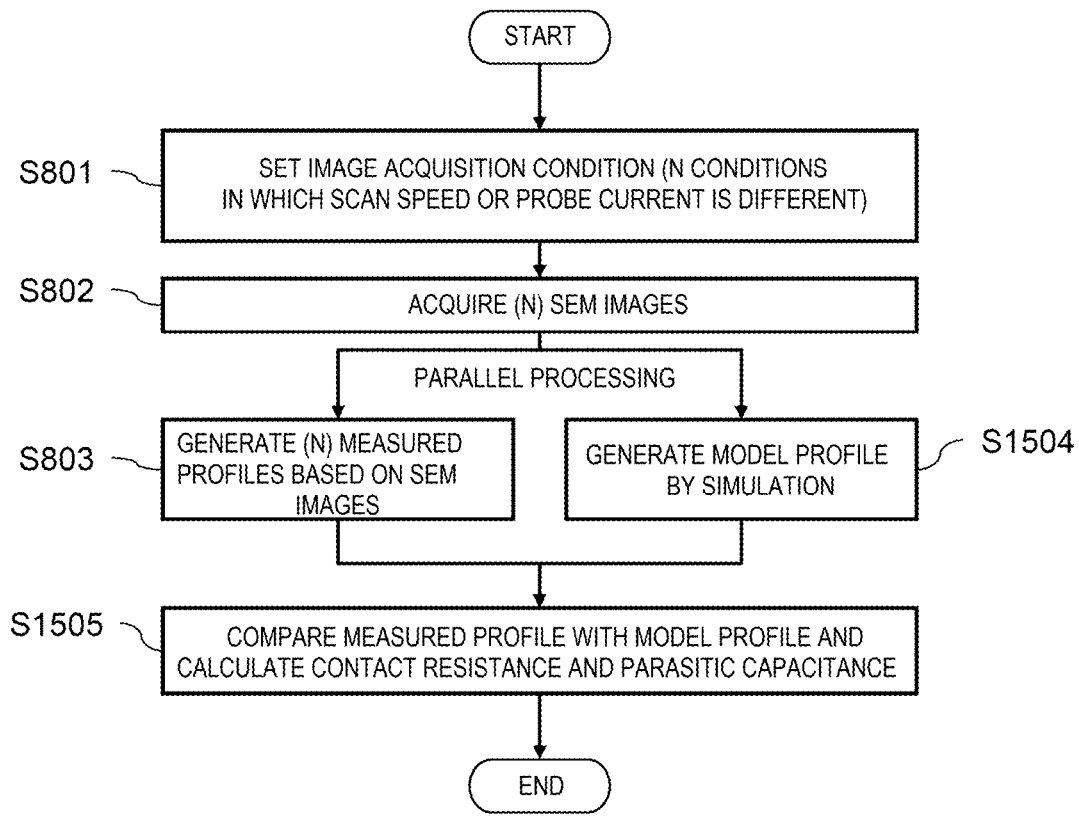
FIG. 15 is a flowchart illustrating an exemplary processing procedure for calculating an electrical contact characteristic of a pattern performed by the image processing device.

FIG. 15 is a flowchart illustrating an exemplary processing procedure for calculating the pattern electrical contact characteristic performed by the control device 115. Specifically, for example, the processing illustrated in the flowchart of FIG. 15 is implemented by causing the processor 301 to perform a program stored in the storage device 302 illustrated in FIG. 3. The control device 115 performs step S803 and step S1504 in parallel after performing step S801 and step S802.

In step S1504, the control device 115 generates a model profile by a simulation (step S1504). Here, the model profile is a profile calculated to reproduce an actually measured profile that is obtained under N image acquisition conditions set in step S801, with the contact resistance R and the parasitic capacitance C as parameters. The control device 115 performs calculation in cases where various contact resistance R and parasitic capacitance C are assumed.

Figure 16:
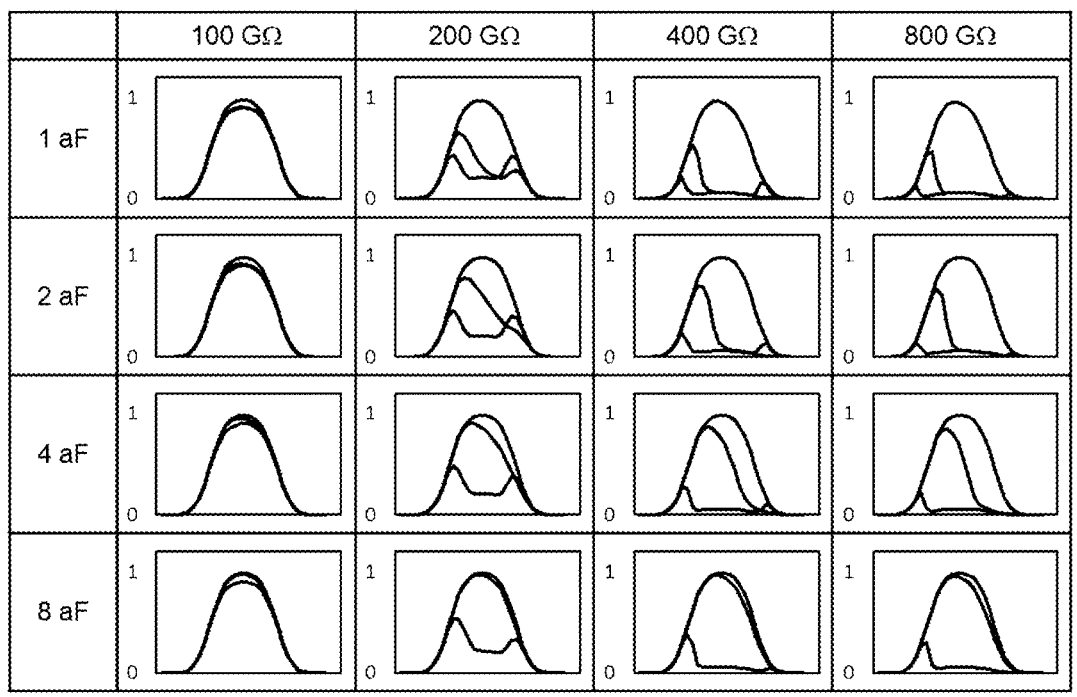
FIG. 16 is an explanatory diagram illustrating exemplary model profiles.

FIG. 16 is an explanatory diagram illustrating exemplary model profiles. FIG. 16 illustrates model profiles of images in which the number N of acquisition conditions is N=3, four contact resistances R are 100 [GΩ], 200 [GΩ], 400 [GΩ], and 800 [GΩ], and four parasitic capacitances C are 1 [aF], 2 [aF], 4 [aF], and 8 [aF].

Returning to FIG. 15, the control device 115 compares the actually measured profile acquired in S803 with a plurality of model profiles calculated in step S1504, and calculates the contact resistance R and the parasitic capacitance C. For example, in a case where the actually measured profile has a shape illustrated in FIG. 10, the control device 115 determines a model profile in which the contact resistance R=200[GΩ] and the parasitic capacitance C=2 [aF], among the model profile group in FIG. 16, to have the closest shape. Therefore, the control device 115 can determine the contact resistance R=200[GΩ] and the parasitic capacitance C=2 [aF] as the electrical contact characteristic of the pattern 501.

In a method of determining a model profile best matching an actually measured profile in shape, the actually measured profile may be displayed in the plot as illustrated in FIG. 10 and FIG. 16 and then be selected by an operator of the SEM 100.

Further, a method may be used in which the control device 115 calculates an index value that evaluates the similarity between a matrix of N rows of N actually measured profiles and a similar matrix of N rows of N model profiles, and selects the most similar model profile. Specifically, for example, the control device 115, for each combination of the contact resistance R and the parasitic capacitance C, creates a matrix (hereinafter referred to as actually measured matrix) of N rows and M columns for the N actually measured profiles (the number of plotted data on the horizontal axis indicating the scan position is set as M) and similarly creates another matrix (hereinafter referred to as model matrix) of N rows and M columns for the N model profiles.

The control device 115 calculates the similarity between the actually measured matrix and the model matrix for each combination of the contact resistance R and the parasitic capacitance C. Specifically, for example, the control device 115 calculates the sum of squares of a difference of the same element between the actually measured matrix and the model matrix as the similarity of each combination of the contact resistance R and the parasitic capacitance C. In this case, the smaller the sum of squares is, the more similar the actually measured profile and the model profile are. The control device 115 determines a combination of the contact resistance R and the parasitic capacitance C having the lowest similarity (the sum of squares) as the electrical contact characteristic of the pattern 501, as a result of calculating the similarity between the actually measured matrix and the model matrix for each combination of the contact resistance R and the parasitic capacitance C.

In a case where a sample 107 to be inspected is the sample 107 illustrated in FIG. 7, the control device 115 may extract actually measured profiles only in an area corresponding to the pattern 501 at the lower stage in step S803 of FIG. 15, perform simulations by assuming a plurality of patterns in step S1504, and extract model profiles in the same area where the profiles are extracted in step S803. Accordingly, similar to the sample 107 illustrated in FIG. 5, the electrical contact characteristic can be calculated.

Further, with the processing of FIG. 15, the control device 115 obtains the contact resistance R and the parasitic capacitance C of the pattern 701 at the top stage in FIG. 7 in advance. Then, when the processing of FIG. 15 is applied to the pattern 501 at the lower stage, the control device 115 may calculate the plurality of model profiles illustrated in FIG. 16 taking the contact resistance R and the parasitic capacitance C of the pattern 701 at the top stage as fixed values, and taking the contact resistance R and the parasitic capacitance C of the pattern 501 at the lower stage as parameters in step S1504. Accordingly, the contact resistance R and the parasitic capacitance C of the pattern 501 at the lower stage can be obtained.

Accordingly, the contact resistance R and the parasitic capacitance C can be estimated according to Embodiment 2.

Therefore, for example, in the electrical contact inspection of the semiconductor device, not only determination of non-defect/defect can be achieved, but also a case where the electrical connection is made but the contact resistance R is high can be detected, so that a high-accuracy inspection is possible. Further, based on the magnitude of the parasitic capacitance C, it can be estimated which part of the semiconductor circuit generates an electrical contact defect.

Embodiment 3

Next, Embodiment 3 will be described. The control device 115 of Embodiment 2 sets multiple combinations of the contact resistance R and the parasitic capacitance C and estimates the most suitable combination of the contact resistance R and the parasitic capacitance C therefrom. In contrast to this, the control device 115 of Embodiment 3 performs a Monte Carlo simulation of electron beam scattering so as to generate a model profile in step S1504 of FIG. 15 in Embodiment 2.

Exemplary Processing Procedure for Calculating Model Profile

Figure 17:
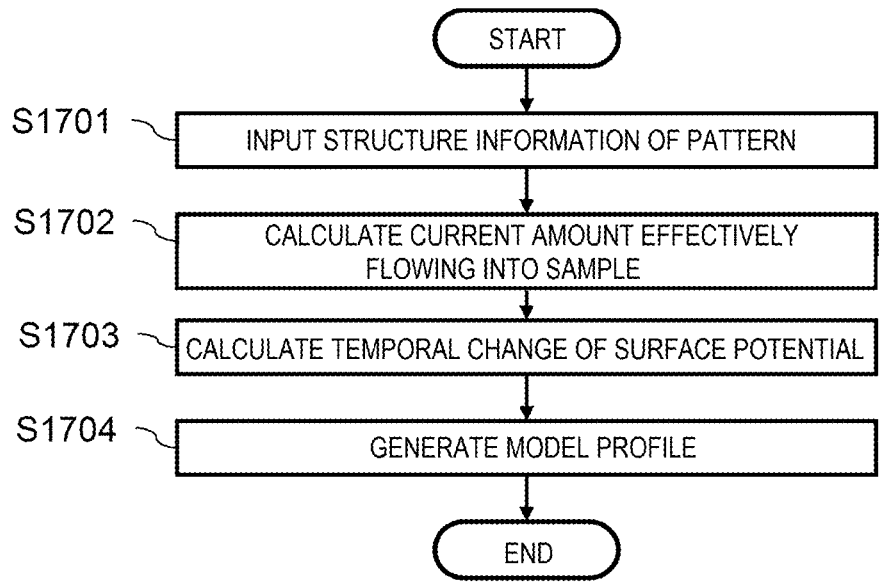
FIG. 17 is a flowchart illustrating an exemplary processing procedure for calculating a model profile performed by the image processing device.

FIG. 17 is a flowchart illustrating an exemplary processing procedure for calculating a model profile performed by the control device 115. Specifically, for example, the processing illustrated in the flowchart of FIG. 17 is implemented by causing the processor 301 to perform a program stored in the storage device 302 illustrated in FIG. 3.

The control device 115 first receives input of structure information of the pattern 501 (step S1701). The structure information of the pattern 501 includes a three-dimensional shape, a dimension and identification information of atoms serving as materials of the pattern 501. Here, the shape may be a preset fixed value such as a designed value. Further, only the qualitative shape may be set, and an actual measurement value may be input for the detailed dimension.

The control device 115 may measure the dimension of the pattern 501 based on an SEM image 600 that has the highest brightness of the pattern 501 among the N SEM images 600 obtained in step S802, may measure the dimension of the pattern 501 using an average measurement value obtained based on the N SEM images 600, and may measure the dimension of the pattern 501 based on an SEM image 600 obtained differently from step S802 under image acquisition conditions suitable for dimension measurement. The control device 115 stores information relating to atoms necessary for the Monte Carlo simulation of electron beam scattering, such as the atomic weight and the number of electron(s) in the atom for each of the atoms. When the identification information of the atom is input, the control device 115 can identify the information relating to the atom.

Next, the control device 115 calculates a current amount $I_0$ effectively flowing into the sample 107 (step S1702). Specifically, for example, the control device 115 uses the structure information of the pattern 501 set in step S1701, performs the Monte Carlo simulation of electron beam scattering and obtains scan position dependency of the current amount $I_e$ of the emitted electrons from the sample 107. The current amount $I_0$ effectively flowing into the sample 107 is obtained as a difference between the current amount $I_e$ of the emitted electrons from the sample 107 and the current amount, that is, the probe current (amount) $I_p$ of the incident electron beam 102.

Figure 18:
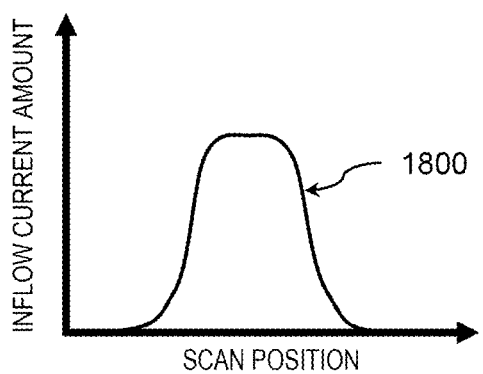
FIG. 18 is a graph illustrating an example of scan position dependency of a current amount effectively flowing into the sample.

FIG. 18 is a graph illustrating an example of scan position dependency of the current amount $I_0$ effectively flowing into the sample 107. In FIG. 18, the horizontal axis represents the scan position of the incident electron beam 102 and the vertical axis represents the current amount (inflow current amount) $I_0$ effectively flowing into the sample 107. According to scan position dependency 1800, it can be seen that the current amount $I_0$ flowing into the sample 107 increases in positions where the pattern 501 exists. Although not illustrated in FIG. 18, the current amount $I_0$ effectively flowing into the sample 107 may become negative in a case where the current amount of the signal electrons 400 emitted from the sample 107 is small. In a case where the incident electron beam 102 is incident at an incident angle θ as illustrated in FIG. 7, or a plurality of patterns 501 exist, the control device 115 may perform the Monte Carlo simulation considering the above.

Returning to FIG. 17, the control device 115 takes the contact resistance R and the parasitic capacitance C as parameters, and calculates a temporal change in surface potential V of the pattern 501 based on the scan position dependency 1800 of the inflow current amount $I_0$ obtained in step S1702 (step S1703).

Figure 19:
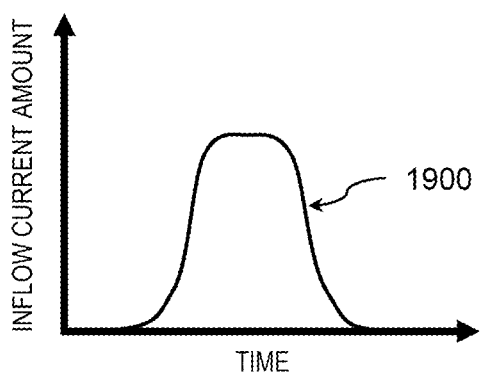
FIG. 19 is a graph illustrating a temporal change in inflow current amount.

FIG. 19 is a graph illustrating a temporal change in inflow current amount $I_0$. In FIG. 19, the horizontal axis represents the scan time of the incident electron beam 102 and the vertical axis represents the current amount (inflow current amount) $I_0$ effectively flowing into the sample 107. According to the temporal change 1900 in inflow current amount $I_0$, it can be seen that the current amount $I_0$ effectively flowing into the sample 107 increases in time periods when the pattern 501 is scanned. Specifically, for example, the control device 115 divides the horizontal axis of the scan position dependency 1800 of the inflow current amount $I_0$ by the scan speed of the incident electron beam 102, so as to convert the scan position dependency 1800 of the inflow current amount $I_0$ into the temporal change 1900 in inflow current amount $I_0$. Then, the control device 115 calculates the temporal change in surface potential V of the pattern 501 based on the temporal change 1900 in inflow current amount $I_0$ obtained in FIG. 19.

Figure 20:
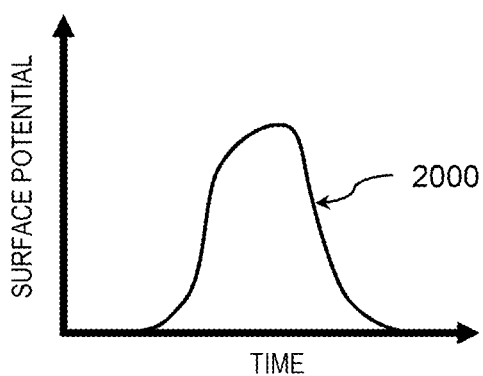
FIG. 20 is a graph illustrating a temporal change in surface potential V of the pattern.

FIG. 20 is a graph illustrating the temporal change in surface potential V of the pattern 501. In FIG. 20, the horizontal axis represents the scan time of the incident electron beam 102 and the vertical axis represents the surface potential V of the pattern 501. According to a temporal change 2000 in surface potential V of the pattern 501, it can be seen that charging to the surface of the sample 107 increases in time periods when the pattern 501 is scanned. The temporal change 2000 in surface potential V of the pattern 501 is obtained by the Formula (1) described below.

Figure 21:
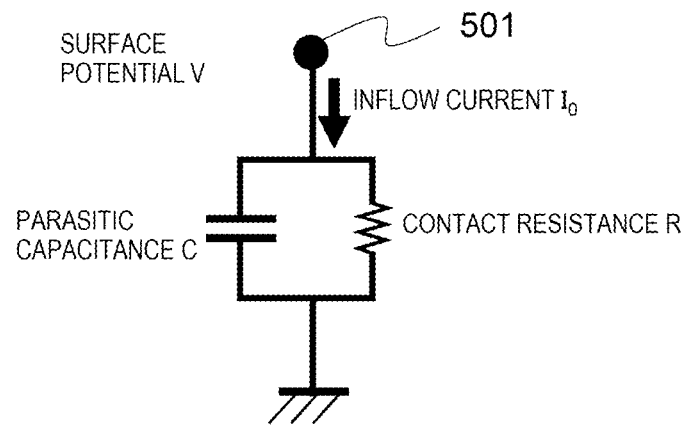
FIG. 21 is a circuit diagram illustrating an example of an equivalent circuit that shows a nanowire-shaped fine pattern.

FIG. 21 is a circuit diagram illustrating an example of equivalent circuit that shows a nanowire-shaped fine pattern 501. In the pattern 501, the contact resistance R and the parasitic capacitance C are connected in parallel and are grounded. The surface potential of the pattern 501 is V, and the current of the inflow current amount $I_0$ flows. A time differential dV/dt of the surface potential V can be obtained by the Formula (1) described below. For the contact resistance R and the parasitic capacitance C, any combination illustrated in FIG. 16 can be applied, for example.

$$dV/dt = (I_0 R - V)/(CR) \qquad (1)$$

The temporal change 2000 in surface potential V is obtained by performing integration on the Formula (1). Specifically, for example, the temporal change 2000 in surface potential V is obtained for each combination of the contact resistance R and the parasitic capacitance C.

Returning to FIG. 17, the control device 115 generates a model profile for each combination of the contact resistance R and the parasitic capacitance C based on a signal electron detection rate (step S1704) and the processing proceeds to step S1505. Specifically, for example, the control device 115 obtains a model profile for each combination of the contact resistance R and the parasitic capacitance C based on the temporal change 2000 in surface potential V obtained in step S1703. In obtaining the model profile, the control device 115 can obtain a temporal change in signal electron detection rate by using surface potential dependency 1400 in FIG. 14.

Figure 22:
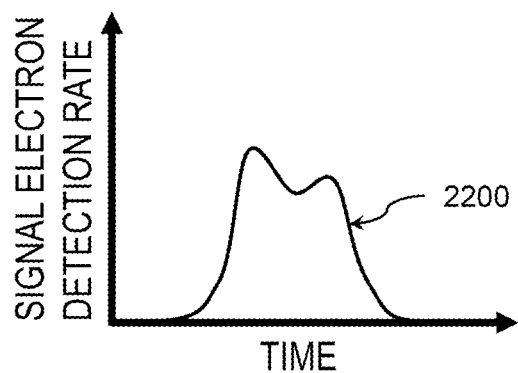
FIG. 22 is a graph illustrating a temporal change in signal electron detection rate.

FIG. 22 is a graph illustrating the temporal change in signal electron detection rate. In FIG. 22, the horizontal axis represents the scan time of the incident electron beam 102 and the vertical axis represents the signal electron detection rate. According to the temporal change 2000 in signal electron detection rate, it can be seen that the signal electron detection rate increases in time periods when the pattern 501 is scanned.

The control device 115 further converts the temporal change 2000 in signal electron detection rate into scan position dependency of the signal electron detection rate by multiplying time on the horizontal axis in FIG. 22 by the scan speed.

Figure 23:
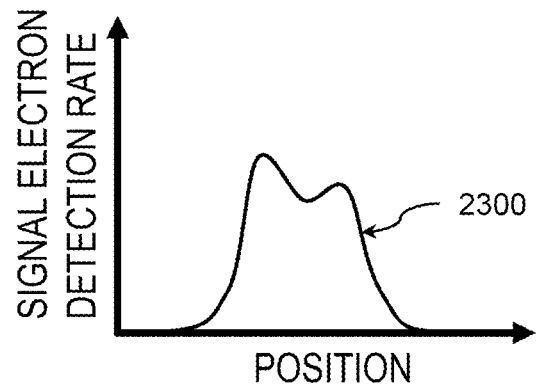
FIG. 23 is a graph illustrating scan position dependency of the signal electron detection rate.

FIG. 23 is a graph illustrating the scan position dependency of the signal electron detection rate. In FIG. 23, the horizontal axis represents the scan position of the incident electron beam 102 and the vertical axis represents the signal electron detection rate. According to scan position dependency 2300 of the signal electron detection rate, it can be seen that the signal electron detection rate increases in positions where the pattern 501 is scanned. The signal electron detection rate and the brightness may be regarded as approximately proportional to each other. Therefore, the scan position dependency 2300 of the signal electron detection rate illustrated in FIG. 23 can be regarded as a brightness profile.

In this way, the control device 115 can acquire the brightness profile, that is, the model profile, obtained by calculation, for each combination of the contact resistance R and the parasitic capacitance C. Further, in order to calculate the brightness profile more accurately, it is desirable that the control device 115 acquires a calibration curve about a relationship between the signal electron detection rate and the brightness in a different manner and calculates the brightness of the SEM image 600 based on the calculated number of the signal electrons.

The relationship between the surface potential and the signal electron detection rate used in FIG. 17 may be calculated by a simulation by the control device 115. Alternatively, the above relationship may be actually measured by conducting an experiment that changes the potential of the sample 107. Alternatively, the control device 115 may filter electrons accelerated by a threshold voltage or a lower voltage using the energy filter 200 so as to simulate a state where the surface potential is the same as the threshold voltage, and thus use a change in brightness when the threshold voltage is changed, to calculate the above relationship.

Embodiment 3 has described the method of calculating the model profile one by one using the Monte Carlo simulation of electron beam scattering by the control device 115. However, the Monte Carlo simulation may be performed in advance with several representative dimensions, so as to obtain and store the model profiles as a library in a case where the dimension variation of the pattern 501 is small. In this case, when obtaining the model profiles individually, the control device 115 may shorten the calculation time by performing estimation through interpolating data of the library based on a dimension value.

Accordingly, the contact resistance R and the parasitic capacitance C can be estimated with higher accuracy than that in Embodiment 2, according to Embodiment 3. Therefore, for example, in the electrical contact inspection of the semiconductor device, not only determination of non-defect/defect can be achieved, but also a case where the electrical connection is made but the contact resistance R is high can be detected, so that a high-accuracy inspection is possible. Further, based on the magnitude of the parasitic capacitance C, it can be estimated which part of the semiconductor circuit generates an electrical contact defect.

Embodiment 4

Next, Embodiment 4 will be described. Embodiment 4 illustrates an exemplary method for displaying results obtained in Embodiments 1 to 3.

Figures 24, 25:
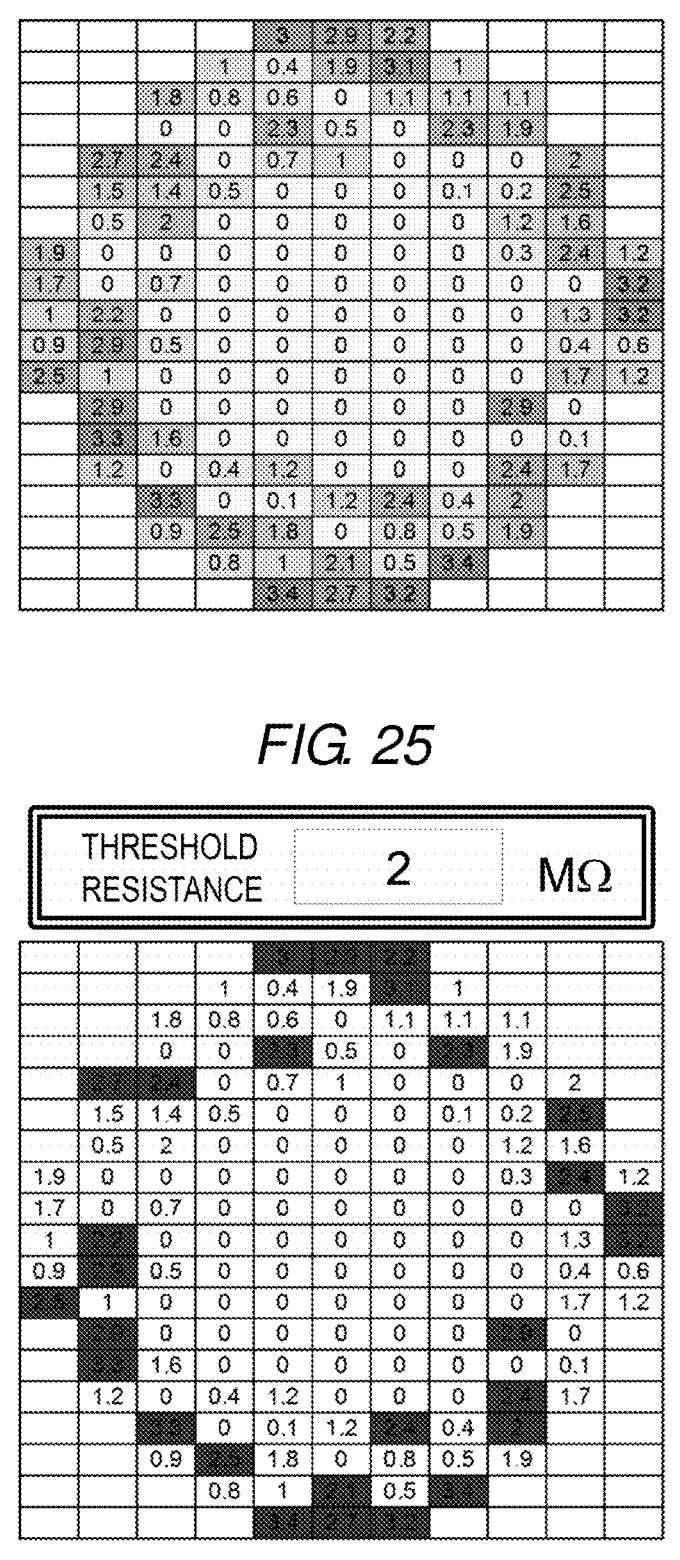

FIG. 24 is an explanatory diagram illustrating a display example 1 that shows distribution of measured contact resistance R values on a wafer surface. By performing such a display, an operator of the SEM 100 can intuitively recognize the surface distribution tendency of the contact resistance R, which can be used for estimating the cause of a contact defect.

FIG. 25 is an explanatory diagram illustrating a display example 2 that shows distribution of measured contact resistance R values on a wafer surface. FIG. 25 illustrates an example in which a threshold resistance is input by the operator of the SEM 100 and only a pattern 501 having a contact resistance R larger than the threshold resistance is determined as a defect. Accordingly, the inspection for defect can be more accurate than before.

Figure 26:
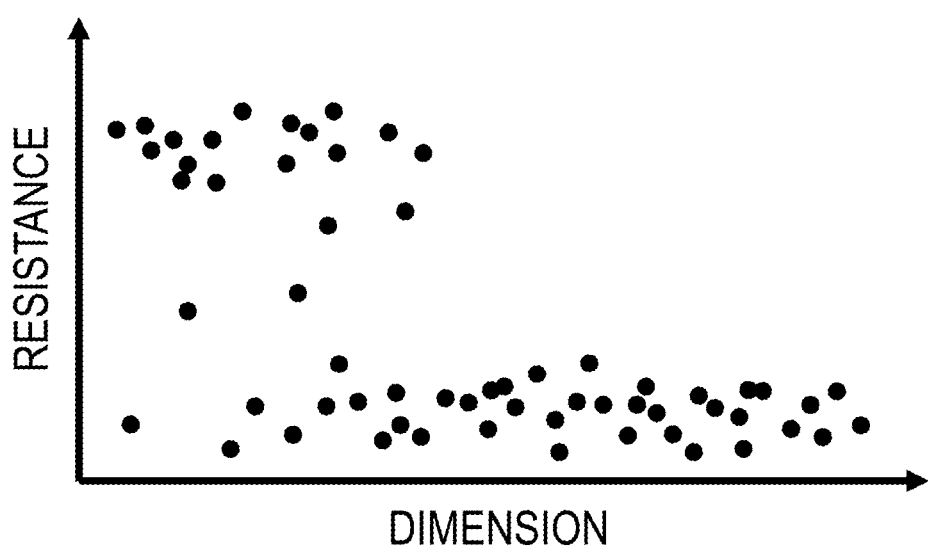
FIG. 26 is an explanation diagram illustrating an exemplary correlation plot for measurement values of the contact resistance and a dimension.

FIG. 26 is an explanation diagram illustrating an exemplary correlation plot for measurement values of the contact resistance R and the dimension. Through performing such a display by the control device 115, the operator can easily determine whether the contact defect is dimension-dependent, due to what dimension the defect generates in a case where the contact defect is dimension-dependent, or the like.

As described above, according to the present embodiment, since the electrical contact characteristic of the pattern 501 can be obtained, the contact resistance R and the parasitic capacitance C of the pattern 501 can be measured quantitatively. Further, a case where the relaxation time T of leakage of the pattern 501 is short is also applicable. Therefore, the inspection system 1 and the control device 115 can evaluate the electrical contact of the fine pattern 501 formed in a semiconductor wafer, during a manufacturing process of a semiconductor device in a non-destructive and non-contact manner.

It should be noted that the invention is not limited to the above-described embodiments and includes various modifications and equivalent configurations within the spirit of the claims. For example, the above-described embodiments have been described in detail in order to make the invention easy to understand, and the invention is not necessarily limited to those which have all the configurations described. Further, a part of a configuration of a certain embodiment may be replaced with a configuration of another embodiment. Further, a configuration of another embodiment may be added to a configuration of a certain embodiment. Further, another configuration may be added to, subtracted from or replaced with a part of a configuration of each embodiment.

Further, parts or all of the configurations, functions, processing units, processing methods and the like may be realized by hardware, for example, by designing with an integrated circuit, or may be realized by software by a processor interpreting and executing a program that implements each function.

Information on programs, tables, files and the like for implementing each function can be stored in a memory device such as a memory, a hard disk, and an SSD (Solid State Drive), or a recording medium such as an IC (Integrated Circuit) card, an SD card, and a DVD (Digital Versatile Disc).

Further, control lines and information lines indicates what is considered to be necessary for the description, and do not necessarily indicate all the control lines and information lines that are necessary for mounting. In practice, it can be considered that almost all the configurations are interconnected.

What is claimed is:

1. An inspection system, comprising:
   a microscope that scans a sample with a beam that is an incident electron beam; and
   an image processing device that controls the microscope, wherein the image processing device performs:
   an acquisition process of acquiring a plurality of images relating to brightness based on an amount of a signal electron detected from the sample as a result of controlling the microscope according to a plurality of image acquisition conditions and irradiating the sample with the incident electron beam, the plurality of image acquisition conditions being multiple combinations of different irradiation amounts of the beam per unit length;
   a first generation process of generating a plurality of actually measured profiles that show a relationship between an irradiation position of the incident electron beam in the sample and the brightness of the sample, based on the plurality of images acquired in the acquisition process; and
   an output process of outputting an electrical contact characteristic of the sample based on the plurality of actually measured profiles generated in the first generation process.

2. The inspection system according to claim 1, wherein the plurality of image acquisition conditions are multiple combinations of a scan speed of the beam and a probe current that is a current of the beam.

3. The inspection system according to claim 2, wherein in the output process, in a case where the scan speed is different in the plurality of image acquisition conditions, the image processing device calculates the electrical contact characteristic based on a specified scan speed of the beam obtained from the plurality of actually measured profiles and based on a distance that the beam passes through the sample in a scan direction of the beam.

4. The inspection system according to claim 3, wherein in the output process, based on a relaxation time calculated as the electrical contact characteristic and either one of a contact resistance and a parasitic capacitance of the sample, the image processing device calculates the other one of the contact resistance and the parasitic capacitance of the sample.

5. The inspection system according to claim 2, wherein in the output process, in a case where the probe current is different in the plurality of image acquisition conditions, the image processing device calculates a contact resistance of the sample as the electrical contact characteristic based on a specified probe current of the beam obtained from the plurality of actually measured profiles and based on an accelerating voltage of an electron emitted from the sample as a result of irradiating the sample with the beam.

6. The inspection system according to claim 1, wherein the image processing device performs
   a second generation process of generating a plurality of model profiles that show the relationship between the irradiation position of the beam in the sample and the brightness of the sample, based on the plurality of images and multiple combinations of a contact resistance and a parasitic capacitance, and
   in the output process, the image processing device outputs the actually measured profiles generated in the first generation process and a plurality of model profiles generated in the second generation process in a displayable manner.

7. The inspection system according to claim 6, wherein in the output process, the image processing device compares the plurality of actually measured profiles and the plurality of model profiles, and outputs a contact resistance and a parasitic capacitance to be the electrical contact characteristic from the multiple combinations of the contact resistance and the parasitic capacitance.

8. The inspection system according to claim 6, wherein in the second generation process, the image processing device performs electron beam scattering simulation in the sample by using structure information of the sample so as to generate the plurality of model profiles.

9. The inspection system according to claim 8, wherein in the second generation process, the image processing device calculates a current amount effectively flowing into the sample by performing the electron beam scattering simulation, calculates a temporal change in surface potential of the sample for each of the multiple combinations of the contact resistance and the parasitic capacitance, based on the current amount effectively flowing and the multiple combinations of the contact resistance and the parasitic capacitance, and generates the plurality of model profiles based on the temporal change in surface potential of the sample.

10. An image processing device, configured to process an image obtained by a microscope that scans a sample with a beam that is an incident electron beam, and to perform:
    an acquisition process of acquiring a plurality of images relating to brightness based on an amount of a signal electron detected from the sample as a result of controlling the microscope according to a plurality of image acquisition conditions and irradiating the sample with the incident electron beam, the plurality of image acquisition conditions being multiple combinations of different irradiation amounts of the beam per unit length;
    a first generation process of generating a plurality of actually measured profiles that show a relationship between an irradiation position of the beam in the sample and the brightness of the sample, based on the plurality of images acquired in the acquisition process; and
    an output process of outputting an electrical contact characteristic of the sample based on the plurality of actually measured profiles generated in the first generation process.

11. An inspection method that controls a microscope that scans a sample with a beam that is an incident electron beam, the inspection method comprising:
- an acquisition process of acquiring a plurality of images relating to brightness based on an amount of a signal electron detected from the sample as a result of controlling the microscope according to a plurality of image acquisition conditions and irradiating the sample with the incident electron beam, the plurality of image acquisition conditions being multiple combinations of different irradiation amounts of the beam per unit length;
- a first generation process of generating a plurality of actually measured profiles that show a relationship between an irradiation position of the beam in the sample and the brightness of the sample, based on the plurality of images acquired in the acquisition process; and
- an output process of outputting an electrical contact characteristic of the sample based on the plurality of actually measured profiles generated in the first generation process.

12. The inspection method according to claim 11,
wherein the plurality of image acquisition conditions are multiple combinations of a scan speed of the beam and a probe current that is a current of the beam.

13. The inspection method according to claim 12,
wherein in the output process, in a case where the scan speed is different in the plurality of image acquisition conditions, the image processing device calculates the electrical contact characteristic based on a specified scan speed of the beam obtained from the plurality of actually measured profiles and based on a distance that the beam passes through the sample in a scan direction of the beam.

14. The inspection method according to claim 13,
wherein in the output process, based on a relaxation time calculated as the electrical contact characteristic and either one of a contact resistance and a parasitic capacitance of the sample, the image processing device calculates the other one of the contact resistance and the parasitic capacitance of the sample.

15. The inspection method according to claim 12,
wherein in the output process, in a case where the probe current is different in the plurality of image acquisition conditions, the image processing device calculates a contact resistance of the sample as the electrical contact characteristic, based on a specified probe current of the beam obtained from the plurality of actually measured profiles and based on an accelerating voltage of an electron emitted from the sample as a result of irradiating the sample with the beam.

* * * * *